US012689367B2

(12) United States Patent
Lee et al.

(10) Patent No.: US 12,689,367 B2
(45) Date of Patent: Jul. 21, 2026

(54) RELAY DRIVING CIRCUIT AND BATTERY SYSTEM HAVING THE SAME

(71) Applicant: LG ENERGY SOLUTION, LTD., Seoul (KR)

(72) Inventors: Gyuyeol Lee, Daejeon (KR); Hyun Han, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 693 days.

(21) Appl. No.: 18/011,301

(22) PCT Filed: Jan. 11, 2022

(86) PCT No.: PCT/KR2022/000485
§ 371 (c)(1),
(2) Date: Dec. 19, 2022

(87) PCT Pub. No.: WO2022/154438
PCT Pub. Date: Jul. 21, 2022

(65) Prior Publication Data
US 2023/0198519 A1    Jun. 22, 2023

(30) Foreign Application Priority Data
Jan. 12, 2021    (KR) ........................ 10-2021-0004142

(51) Int. Cl.
*H03K 17/687* (2006.01)
*H02J 7/00* (2026.01)
*H02J 7/90* (2026.01)
(52) U.S. Cl.
CPC ............ *H03K 17/687* (2013.01); *H02J 7/855* (2026.01); *H02J 7/90* (2026.01)
(58) Field of Classification Search
CPC ...................................................... H02J 7/007
See application file for complete search history.

(56) References Cited

U.S. PATENT DOCUMENTS 6,124,700 A * 9/2000 Nagai ................... H02J 7/0071
                                                    320/132
7,859,234 B2 * 12/2010 Huang ................. H03K 17/687
                                                    323/353
(Continued)

FOREIGN PATENT DOCUMENTS

CN        110112038 A      8/2019
CN        110710081 A      1/2020
(Continued)

OTHER PUBLICATIONS

Precharging Device and DC/DC Voltage Converter Comprising Such a Precharging Device, Ferrand (Year: 2025).*
(Continued)

*Primary Examiner* — Tynese V Mcdaniel
(74) *Attorney, Agent, or Firm* — Birch, Stewart, Kolasch & Birch, LLP

(57) ABSTRACT

The present invention relates to a relay driving circuit and a battery system for generating a gate voltage for controlling ON/OFF of a pre-charge relay, and provides a relay driving circuit that controls electrical connection between an external device and a battery pack, including: a transistor that receives a control signal of an enable level to perform an ON operation; a first resistor having a first end connected to a positive electrode of the battery pack and a second end connected to the relay, by the ON operation of the transistor; and a second resistor connected between the second end of the first resistor and the external device, the relay receives power supplied from the battery pack in a ratio of a resistance value of the second resistor to a sum resistance value of the first resistor and the second resistor to perform an ON operation.

11 Claims, 3 Drawing Sheets

(56) References Cited

U.S. PATENT DOCUMENTS

| | | | | |
|---|---|---|---|---|
| 8,508,201 | B2* | 8/2013 | Kawashima | H01H 47/325 323/222 |
| 9,722,594 | B2* | 8/2017 | Nagase | H03K 17/6877 |
| 9,925,933 | B2* | 3/2018 | Hartl | B60L 50/66 |
| 11,398,650 | B2* | 7/2022 | Fan | H01M 10/4257 |
| 2006/0255768 | A1* | 11/2006 | Yoshio | H02J 7/007182 320/134 |
| 2007/0108959 | A1* | 5/2007 | Amano | H01H 9/542 323/351 |
| 2009/0168822 | A1* | 7/2009 | Hung | G11B 7/126 372/38.03 |
| 2009/0295401 | A1* | 12/2009 | Kamata | G01R 31/52 324/509 |
| 2012/0139479 | A1 | 6/2012 | Yun | |
| 2012/0256611 | A1* | 10/2012 | Fukui | B60L 3/003 323/304 |
| 2013/0314834 | A1* | 11/2013 | Tamaki | H03K 17/06 327/109 |
| 2014/0075216 | A1* | 3/2014 | Guo | G06F 1/26 713/310 |
| 2014/0239713 | A1 | 8/2014 | Kanzaki et al. | |
| 2015/0035539 | A1 | 2/2015 | Wakida et al. | |
| 2015/0070078 | A1* | 3/2015 | Jeong | H03K 17/18 327/478 |
| 2015/0210232 | A1* | 7/2015 | Kanzaki | H02H 7/18 701/36 |
| 2015/0251542 | A1* | 9/2015 | Mensah-Brown | B60L 50/40 307/10.1 |
| 2015/0263559 | A1 | 9/2015 | Kim | |
| 2016/0105054 | A1 | 4/2016 | Horito et al. | |
| 2016/0226288 | A1* | 8/2016 | Kuroda | H02J 7/007184 |
| 2017/0201104 | A1 | 7/2017 | Jin et al. | |
| 2018/0345813 | A1* | 12/2018 | Hackner | H02H 9/001 |
| 2020/0144832 | A1 | 5/2020 | Kim | |
| 2021/0258006 | A1* | 8/2021 | Kim | H03K 17/063 |
| 2022/0077764 | A1* | 3/2022 | She | H02J 7/0029 |
| 2022/0376489 | A1* | 11/2022 | Kim | H02J 7/0031 |
| 2023/0067227 | A1* | 3/2023 | Telefus | H02M 1/0003 |
| 2024/0186965 | A1* | 6/2024 | Ouyang | H03F 1/307 |

FOREIGN PATENT DOCUMENTS

| | | | | |
|---|---|---|---|---|
| EP | 3 046 209 | A1 | 7/2016 | |
| FR | 3150662 | A1 * | 1/2025 | H02M 1/0009 |
| JP | 10-164709 | A | 6/1998 | |
| JP | 2000-134707 | A | 5/2000 | |
| JP | 2002-95159 | A | 3/2002 | |
| JP | 2005-32525 | A | 2/2005 | |
| JP | 2005-80456 | A | 3/2005 | |
| JP | 2007-143221 | A | 6/2007 | |
| JP | 4259006 | B2 | 4/2009 | |
| JP | 2011-185812 | A | 9/2011 | |
| JP | 2011-254650 | A | 12/2011 | |
| JP | 2014-166124 | A | 9/2014 | |
| JP | 2015-33143 | A | 2/2015 | |
| JP | 2015-56928 | A | 3/2015 | |
| JP | 2015-140094 | A | 8/2015 | |
| KR | 10-2005-0067779 | A | 7/2005 | |
| KR | 10-1182890 | B1 | 9/2012 | |
| KR | 10-2015-0050858 | A | 5/2015 | |
| KR | 10-2015-0083739 | A | 7/2015 | |
| KR | 10-1733740 | B1 | 5/2017 | |
| KR | 10-1745055 | B1 | 6/2017 | |
| KR | 10-2018-0089821 | A | 8/2018 | |

OTHER PUBLICATIONS

International Search Report (PCT/ISA/210) issued in PCT/KR2022/000485, dated May 2, 2022.
Japanese Office Action for Japanese Application No. 2022-573720, dated Jan. 21, 2025, with English translation.
Extended European Search Report for European Application No. 22739633.0, dated Nov. 9, 2023.

* cited by examiner

RELAY DRIVING CIRCUIT AND BATTERY SYSTEM HAVING THE SAME

CROSS-REFERENCE TO RELATED APPLICATION(S)

This application claims priority to and the benefit of Korean Patent Application No. 10-2021-0004142 filed in the Korean Intellectual Property Office on Jan. 12, 2021, the entire contents of which are incorporated herein by reference.

TECHNICAL FIELD

The present invention relates to a relay driving circuit that generates a gate voltage for controlling on/off of a pre-charge relay, and a battery system having the same.

BACKGROUND ART

A relay is a device that controls on/off of an electric circuit by using a predetermined electrical signal, and is classified into a mechanical relay and an electronic relay according to an operation principle thereof. The mechanical relay uses an electromagnet, and when a current flows through the electromagnet, a magnetic contact is contacted to an electrode so that a circuit is connected, thereby controlling on/off of an electric circuit.

The electronic relay is a relay in which an electrical contact is removed (non-contact) by using a semiconductor switching element in an electrical circuit opening/closing part of the relay. That is, in the electronic relay, when an electrical signal is applied to an input side thereof, a high-load current flows to an output side thereof, thereby controlling the on/off of the electric circuit. The electronic relay is more widely used than the mechanical relay because it may control a high-load output signal even if an input signal is very small, has a long lifespan and fast response speed because there are no mechanical moving parts, and are less affected by impact, vibration, and an installation position.

Meanwhile, a metal-oxide semiconductor field effect transistor (MOSFET) is widely used as a semiconductor switching device, and in order to drive the MOSFET, power must be applied to a gate thereof.

Since a conventional relay driving circuit has a separate power circuit for driving the semiconductor switching device, the relay driving circuit is complicated, an area of the circuit increases, and additional costs occur.

DISCLOSURE

Technical Problem

The present invention is to provide a relay driving circuit and a battery system having the same that may control on/off of a semiconductor switching device by driving a relay driving circuit with power of a battery pack without a separate power circuit.

Technical Solution

An embodiment of the present invention provides a relay driving circuit that controls a relay to control an electrical connection between an external device and a battery pack, including: a transistor configured to receive a control signal of an enable level to perform an ON operation; a first resistor having a first end connected to a positive electrode of the battery pack and a second end connected to the relay, by the ON operation of the transistor; and a second resistor connected between the second end of the first resistor and the external device, wherein the relay receives power supplied from the battery pack in a ratio of a resistance value of the second resistor to a sum resistance value of the first resistor and the second resistor to perform the ON operation.

The relay driving circuit may further include a Zener diode connected in parallel to the second resistor to maintain a level of a voltage between first and second ends of the second resistor.

The transistor may include a first transistor configured to receive a control signal of an enable level to perform an ON operation, and a second transistor configured to receive a voltage of a ground level when the first transistor is turned on to perform an ON operation to electrically connect a positive electrode of the battery pack and the first resistor.

A battery system according to one aspect of the present invention includes: a main relay configured to control an electrical connection between an external device and a battery pack; a pre-charge relay connected in parallel to the main relay and configured to be turned on before the main relay is turned on, and turned off after a predetermined time elapses after the main relay is turned on; a battery management system (BMS) that generates a control signal to control switching of the main relay and switching of the pre-charge relay; and a relay driving circuit including a first relay driving circuit controlling ON/OFF of the pre-charge relay, by including a transistor that receives a first control signal of an enable level from the BMS to perform an ON operation, a first resistor having a first end connected to a positive electrode of the battery pack and a second end connected to the pre-charge relay by the ON operation of the transistor, and a second resistor connected between the second end of the first resistor and the external device, wherein the pre-charge relay receives power supplied from the battery pack in a ratio of a resistance value of the second resistor to a sum resistance value of the first resistor and the second resistor to perform an ON operation.

The first relay driving circuit may further include a Zener diode connected in parallel to the second resistor to maintain a level of a voltage between respective ends of the second resistor.

The transistor may include a first transistor configured to receive the first control signal of the enable level to perform an ON operation, and a second transistor configured to receive a voltage of a ground level when the first transistor is turned on to perform an ON operation to electrically connect a positive electrode of the battery pack and the first resistor.

The pre-charge relay may include a MOSFET that receives power supplied from the battery pack through a gate terminal thereof to perform an ON operation.

Advantageous Effects

The present invention has the effect of simplifying a relay driving circuit, reducing an area thereof, and reducing costs by removing a separate power circuit provided in the relay driving circuit.

DESCRIPTION OF THE DRAWINGS

FIG. 2 illustrates a block diagram in detail a function of a first relay driving circuit of FIG. 1.

FIG. 3 illustrates a block diagram in detail a function of a second relay driving circuit of FIG. 1.

MODE FOR INVENTION

Figure 1:
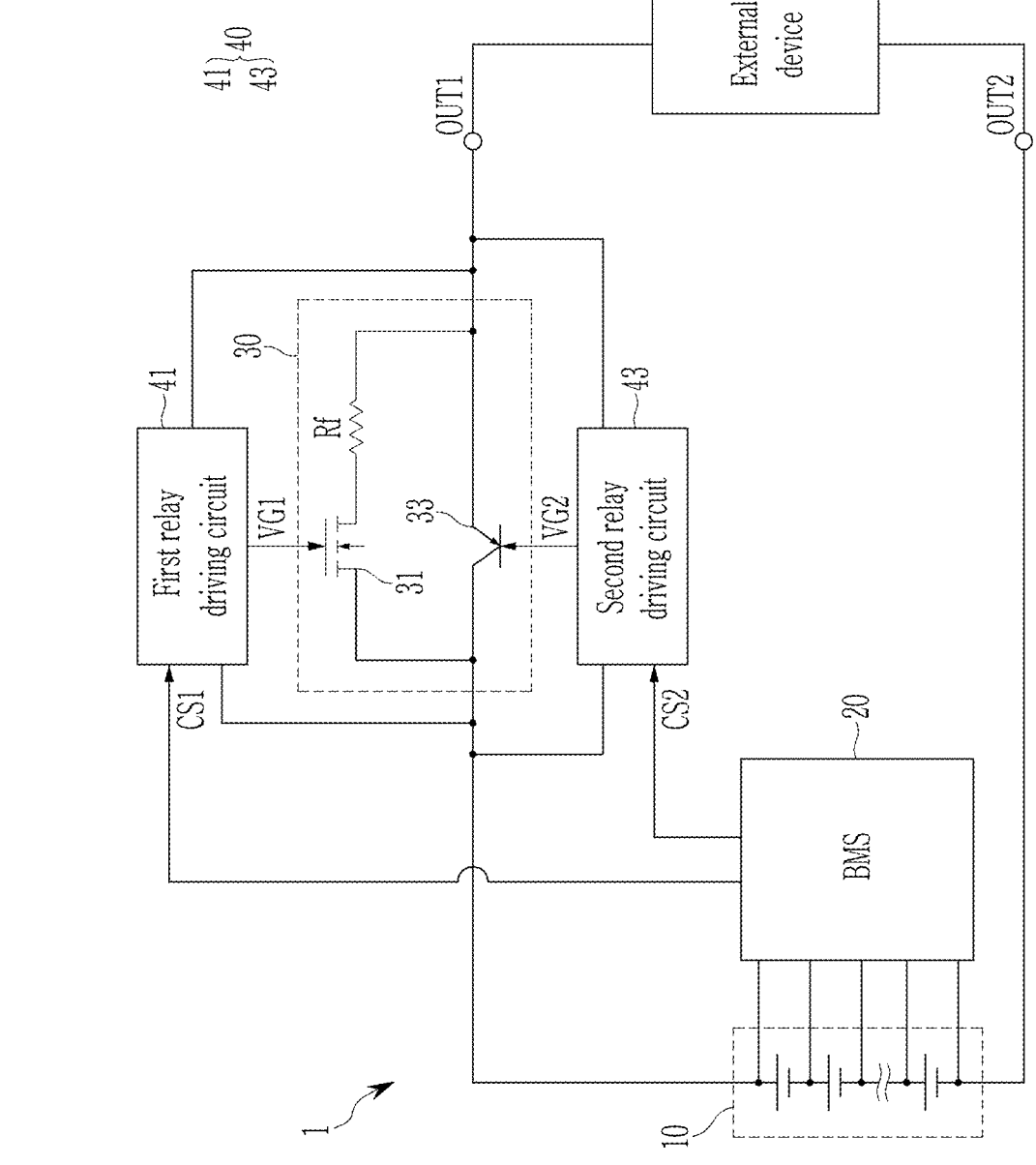
FIG. 1 illustrates a block diagram of a battery system according to an embodiment.

Hereinafter, embodiments disclosed in the present specification will be described in detail with reference to the accompanying drawings, and in the present specification, the same or similar constituent elements will be denoted by the same or similar reference numerals, and a redundant description thereof will be omitted. The terms "module" and/or "unit, portion, or part" representing constituent element used in the following description are used only in order to make understanding of the specification easier, and thus, these terms do not have meanings or roles that distinguish them from each other by themselves. In addition, in describing embodiments of the present specification, when it is determined that a detailed description of the well-known art associated with the present invention may obscure the gist of the present invention, it will be omitted. Further, the accompanying drawings are provided only in order to allow embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like will be used only to describe various constituent elements, and are not to be interpreted as limiting these constituent elements. The terms are only used to differentiate one constituent element from other constituent elements.

It is to be understood that when one constituent element is referred to as being "connected" or "coupled" to another constituent element, it may be connected or coupled directly to the other constituent element or may be connected or coupled to the other constituent element with a further constituent element intervening therebetween. In contrast, it should be understood that, when it is described that an element is "directly coupled" or "directly connected" to another element, no element is present between the element and the other element.

In the present application, it should be understood that the term "include", "comprise", "have", or "configure" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance.

Figure 2:
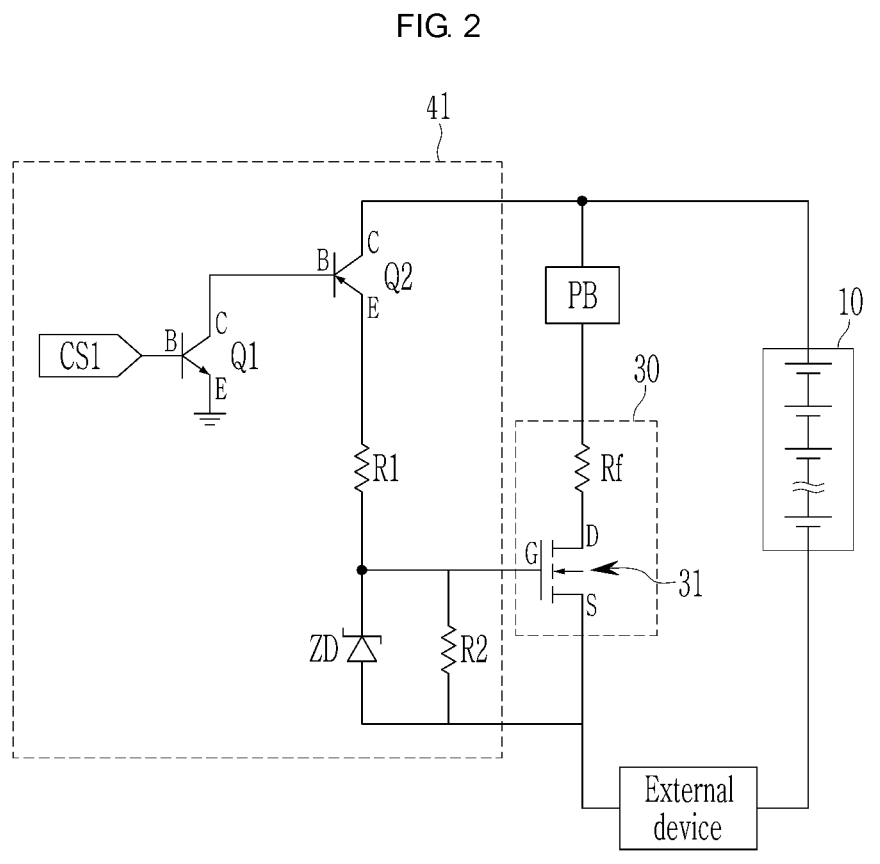
Figure 3:
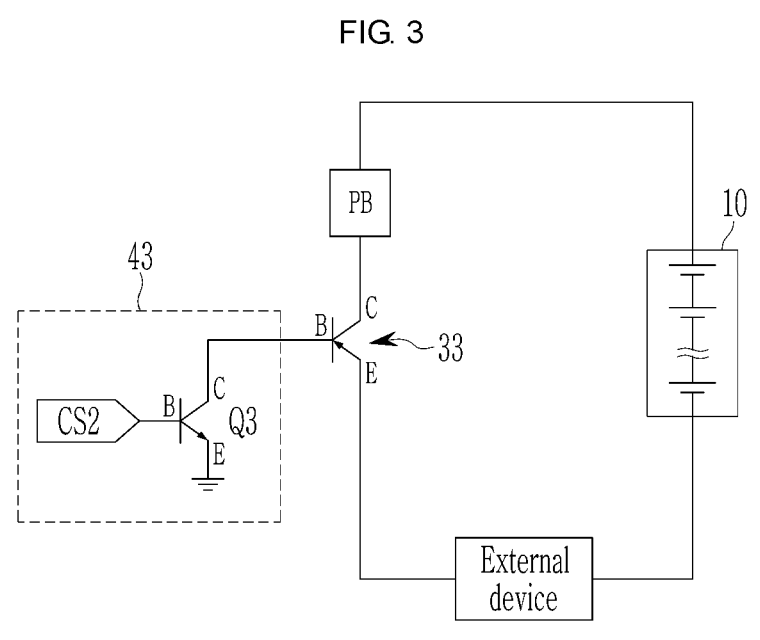

FIG. 1 illustrates a block diagram of a battery system according to an embodiment, FIG. 2 illustrates a block diagram in detail a function of a first relay driving circuit of FIG. 1, and FIG. 3 illustrates a block diagram in detail of a function of a second relay driving circuit of FIG. 1.

Referring to FIG. 1, a battery system 1 includes a battery pack 10, a BMS (battery management system) 20, a relay 30, and a relay driving circuit 40.

The battery pack 10 may supply necessary power by including a plurality of battery cells connected in series/in parallel. In FIG. 1, the battery pack 10 includes a plurality of battery cells connected in series, and is connected between two output terminals OUT1 and OUT2 of the battery system 1, while the relay 30 is connected between a positive electrode and the output terminal OUT1 of the battery system 1. The components shown in FIG. 1 and the connection relationship between the components are an example, and the present invention is not limited thereto.

The BMS 20 may generate a control signal that controls switching of the relay 30 and transmit it to the relay driving circuit 40. For example, the BMS 20 transmits a first control signal CS1 and a second control signal CS2 enabling the relay driving circuit 40 to the relay driving circuit 40.

The relay 30 may include a pre-charge relay 31 and a main relay 33 connected in parallel to the pre-charge relay 31. The relay 30 may be configured as an electronic relay including a semiconductor switching device. For example, as the semiconductor switching device, a metal-oxide semiconductor field effect transistor (MOSFET) or a bipolar junction transistor (BJT) may be used, but the present invention is not limited thereto.

The pre-charge relay 31 may be implemented with a MOSFET, and it may be switched according to a first gate voltage VG1 of an ON level, and may be connected in series to a pre-charge resistor Rf. The pre-charge relay 31 may reduce a surge current occurring when the battery pack 10 and an external device are connected to prevent damage to the main relay 33 due to the surge current. For example, the pre-charge relay 31 is first turned on before the main relay 33 is turned on, and then after a predetermined time elapses, the main relay 33 may turned off to reduce the surge current.

The main relay 33 is implemented with a bipolar junction transistor (BJT) so that it may be switched according to a second gate voltage VG2 of an OFF level. The main relay 33 controls electrical connection between the battery system 1 and the external device (for example, a load and a charger). When the main relay 33 is turned on, the battery system 1 and the external device are electrically connected to each other to perform charging or discharging.

For example, when the external device is a load, a discharging operation in which power is supplied from the battery pack 10 to the load may be performed, and when the external device is a charger, a charging operation in which the battery pack 10 is charged by the charger may be performed. When the main relay 33 is turned off, the battery system 1 and the external device are electrically separated.

The relay driving circuit 40 may include a first relay driving circuit 41 and a second relay driving circuit 43.

The first relay driving circuit 41 receives the first control signal CS1 of an enable level to generate the first gate voltage VG1 capable of turning on the pre-charge relay 31. One end of the first relay driving circuit 41 may be connected to a positive electrode of the battery pack 10, and the other end thereof may be connected to the first output terminal OUT1 of the battery system 1.

Referring to FIG. 2, the first relay driving circuit 41 may include a first transistor Q1, a second transistor Q2, a first resistor R1, a second resistor R2, and a Zener diode ZD. A protection block PB shown in FIG. 2 may include various elements, such as a fuse, to protect the pre-charge relay 31.

A base (B) terminal of the first transistor Q1 receives the first control signal CS1 transmitted from the BMS 20, and a collector (C) terminal of the first transistor Q1 is connected to a base (B) terminal of the second transistor Q2. A collector (C) terminal of the second transistor Q2 is connected to a positive electrode of the battery pack 10, and an emitter (E) terminal of the second transistor Q2 is connected to one end of the first resistor R1. Specifically, the emitter (E) terminal of the second transistor Q2 is connected to one end of the second resistor R2, a cathode of the Zener diode ZD, and a gate (G) terminal of the pre-charge relay 31 through the first resistor R1.

The first transistor Q1 is an NPN type of transistor, which is turned on by a high level of the first control signal CS1 and turned off by a low level thereof. The second transistor Q2 is a PNP type of transistor, which is turned off by a high level of a signal inputted to the base (B) terminal thereof and turned on by a low level thereof.

For example, when the first control signal CS1 of an enable level, for example, of a high level is inputted to the base (B) terminal of the first transistor Q1, the first transistor Q1 is turned on, and the collector (C) terminal of the first transistor Q1 is connected to the ground. A voltage of a ground level is applied to the base (B) terminal of the second transistor Q2 connected to the collector (C) terminal of the first transistor Q1, and the second transistor Q2 is turned on. Thus, the positive electrode of the battery pack 10 and the first resistor R1 are connected to each other through the second transistor Q2, the power supplied from the battery pack 10 is applied to a gate terminal of the MOSFET, and the pre-charge relay 31 is turned on.

One end of the first resistor R1 is connected to the positive electrode of the battery pack 10 due to the turning ON operation of the second transistor Q2, and the other end thereof is connected to the pre-charge relay 31. Specifically, the other end of the first resistor R1 is connected to one end of the second resistor R2, the cathode of the Zener diode ZD, and the gate terminal of the pre-charge relay 31.

The second resistor R2 is connected between the first resistor R1 and the external device. Specifically, one end of the second resistor R2 is connected to the other end of the first resistor R1, and the other end of the second resistor R2 is connected to the external device through the first output terminal OUT1 of the battery system 1.

The Zener diode ZD is connected in parallel to the second resistor R2 to clamp a voltage between respective ends of the second resistor R2 with a breakdown voltage of the Zener diode ZD, so that a level of the first gate voltage VG1 applied to the terminal may be constantly maintained.

Referring to FIG. 2, the pre-charge relay 31 is implemented as a MOSFET, which may be switched according to the first gate voltage VG1 of an ON level. A drain (D) terminal of the MOSFET is connected to the positive electrode of the battery pack 10, and a source(S) terminal of the MOSFET is connected to the external device through the first output terminal OUT1 of the battery system 1. The MOSFET may be turned on by the first gate voltage VG1 applied to a gate (G) terminal thereof to electrically connect the battery pack 10 and the external device.

According to the embodiment, the pre-charge relay 31 receives power (P=VI) supplied from the battery pack 10 according to a ratio (R2/R1+R2) of a resistance value of the second resistor R2 to a sum resistance value of the first resistor R1 and the second resistor R2, and may perform an ON operation. For example, a value of the first gate voltage VG1 may be calculated by multiplying a voltage (V) corresponding to the power of the battery pack 10 and a ratio (R2/R1+R2) of the second resistor R2 to a sum (R1+R2) of the first resistor R1 and the second resistor R2.

The second relay driving circuit 43 may receive the second control signal CS2 of the enable level to turn on the main relay 33. One end of the second relay driving circuit 43 may be connected to a positive electrode of the battery pack 10, and the other end thereof may be connected to the first output terminal OUT1 of the battery system 1.

Referring to FIG. 3, the second relay driving circuit 43 may include a third transistor Q3. A base (B) terminal of the third transistor Q3 receives the second control signal CS2 transmitted from the BMS 20, and a collector (C) terminal thereof is connected to the base (B) terminal of the main relay 33. A protection block PB shown in FIG. 3 may include various elements such as a fuse to protect the main relay 33.

The third transistor Q3 is an NPN type of transistor, which is turned on by the high level of the second control signal CS2 and turned off by the low level thereof. In this case, the main relay 33 is a PNP type of transistor, which is turned off by a high level of a signal inputted to the base (B) terminal thereof, and turned on by a low level thereof.

For example, when the second control signal CS2 of an enable level, for example, of a high level is inputted to the base (B) terminal of the third transistor Q3, the third transistor Q3 is turned on, and the collector (C) terminal of the third transistor Q3 is connected to the ground. A voltage of a ground level is applied to the base (B) terminal of the main relay 33 connected to the collector (C) terminal of the third transistor Q3, and the main relay 33 is turned on. Then, the battery pack 10 and the external device may be electrically connected to each other through the main relay 33.

That is, in the second relay driving circuit 43, the second gate voltage VG2 is not separately generated by using the battery pack 10, and the voltage of the ground (GND) level through the third transistor Q3 may perform a function of the second gate voltage VG2 that may turn on the main relay 33.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

The invention claimed is:

1. A relay driving circuit that controls a relay to control an electrical connection between an external device and a battery pack, comprising:

at least one transistor configured to receive a control signal of an enable level to perform an ON operation;

a first resistor having a first end connected to a positive electrode of the battery pack and a second end connected to the relay, by the ON operation of the at least one transistor; and a second resistor connected between the second end of the first resistor and the external device, wherein the relay receives a gate voltage supplied from the battery pack by multiplying a voltage corresponding to power supplied from the battery pack and a ratio of a resistance value of the second resistor to a sum of resistance values of the first resistor and the second resistor to perform the ON operation, and wherein the at least one transistor includes:

a first transistor including a base configured to receive the control signal from a battery management system (BMS) and an emitter terminal connected to ground; and a second transistor including a base connected to the first transistor, an emitter terminal connected to the first resistor and a collector terminal connected to the battery pack.

2. The relay driving circuit of claim 1, further comprising a Zener diode connected in parallel to the second resistor to maintain a level of a voltage between first and second ends of the second resistor.

3. The relay driving circuit of claim 1, wherein the first transistor is configured to receive the control signal of the enable level to perform on the ON operation, and wherein the second transistor is configured to receive a voltage of a ground level when the first transistor is turned on to perform on the ON operation to electrically connect the positive electrode of the battery pack and the first resistor.

4. A battery system, comprising:

a main relay configured to control an electrical connection between an external device and a battery pack;

a pre-charge relay connected in parallel to the main relay and configured to be turned on before the main relay is turned on, and turned off after a predetermined time elapses after the main relay is turned on;

a battery management system (BMS) that generates a control signal to control switching of the main relay and switching of the pre-charge relay; and a relay driving circuit including a first relay driving circuit controlling ON/OFF of the pre-charge relay, by including at least one transistor that receives a first control signal of an enable level from the BMS to perform an ON operation, a first resistor having a first end connected to a positive electrode of the battery pack and a second end connected to the pre-charge relay by the ON operation of the at least one transistor, and a second resistor connected between the second end of the first resistor and the external device, wherein the pre-charge relay receives a gate voltage supplied from the battery pack by multiplying a voltage corresponding to power supplied from the battery pack to a ratio of a resistance value of the second resistor to a sum of resistance values of the first resistor and the second resistor to perform the ON operation, and wherein the at least one transistor includes:

a first transistor including a base configured to receive the control signal from the BMS and an emitter terminal connected to ground; and a second transistor including a base connected to the first transistor, an emitter terminal connected to the first resistor and a collector terminal connected to the battery pack.

5. The battery system of claim 4, wherein the first relay driving circuit further includes a Zener diode connected to the second resistor in parallel to maintain a level of a voltage between respective ends of the second resistor.

6. The battery system of claim 4, wherein the first transistor is configured to receive the first control signal of the enable level to perform the ON operation, and wherein the second transistor is configured to receive a voltage of a ground level when the first transistor is turned on to perform the ON operation to electrically connect the positive electrode of the battery pack and the first resistor.

7. The battery system of claim 4, wherein the pre-charge relay includes a MOSFET that receives power supplied from the battery pack through a gate terminal thereof to perform the ON operation.

8. The battery system of claim 4, further comprising a second relay driving circuit, wherein the first relay driving circuit and the second relay driving circuit each receive a control signal from the BMS.

9. The battery system of claim 8, wherein the second relay driving circuit includes fewer transistors than the first relay driving circuit.

10. The battery system of claim 4, further comprising:

a first protection block located between the battery pack and the pre-charge relay; and a second protection block located between the battery pack and the main relay.

11. The battery system of claim 10, wherein the pre-charge relay is connected in series to a third resistor, and wherein the third resistor is located between the first protection block and the pre-charge relay.

\* \* \* \* \*